(12) United States Patent
Werner et al.

(10) Patent No.: US 11,121,569 B2
(45) Date of Patent: Sep. 14, 2021

(54) BATTERY STATE-OF-CHARGE INDICATION

(71) Applicant: International Business Machines Corporation, Armonk, NY (US)

(72) Inventors: John S. Werner, Fishkill, NY (US); Kenneth Arenella, Poughkeepsie, NY (US); Arkadiy O. Tsfasman, Wappingers Falls, NY (US); Byron S. Green, Poughkeepsie, NY (US); Robert B. Schlak, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 603 days.

(21) Appl. No.: 15/945,209

(22) Filed: Apr. 4, 2018

(65) Prior Publication Data
US 2019/0312447 A1    Oct. 10, 2019

(51) Int. Cl.
*H02J 7/00* (2006.01)
*H01M 10/48* (2006.01)
(Continued)

(52) U.S. Cl.
CPC ............ *H02J 7/0047* (2013.01); *G01R 31/36* (2013.01); *G01R 31/3646* (2019.01);
(Continued)

(58) Field of Classification Search
CPC ........ H02J 7/0042; H02J 7/0047; H02J 7/345; H01M 10/48
See application file for complete search history.

(56) References Cited

U.S. PATENT DOCUMENTS

| 4,723,566 A | 2/1988 | Kiernan et al. |
| 5,156,931 A | 10/1992 | Burroughs et al. |
(Continued)

FOREIGN PATENT DOCUMENTS

CA    1282115C B1    3/1991

OTHER PUBLICATIONS

A. Barai et al., "Transportation Safety of Lithium Iron Phosphate Batteries—A Feasibility Study of Storing at Very Low States of Charge," Scientific Reports, vol. 7, No. 1, 2017, 5128, 10 pages.

*Primary Examiner* — Richard Isla
*Assistant Examiner* — Johali A Torres Ruiz
(74) *Attorney, Agent, or Firm* — Gregory M. Nordstrom

(57) ABSTRACT

A state-of-charge (SOC) circuit makes a continuous contact with terminals of a battery and monitors voltage of the battery to detect that the battery has an SOC greater than a threshold SOC. In response, the SOC circuit establishes a state of an SOC indicator to indicate that the battery has an SOC greater than the threshold SOC. The threshold SOC corresponds to an SOC of the battery for storing or transporting the battery, and can correspond to a governmental regulatory or commercial SOC. A container for storing and/or transporting a battery includes an SOC circuit and SOC indicator to detect and indicate that a battery, held in the container, has an SOC greater than the threshold SOC. A method uses an SOC circuit and SOC indicator to detect and indicate that a battery has an SOC greater than the threshold SOC.

19 Claims, 6 Drawing Sheets

(51) Int. Cl.
   *G01R 31/36* (2020.01)
   *G01R 31/382* (2019.01)
   *H02J 7/34* (2006.01)
   *G01R 31/385* (2019.01)

(52) U.S. Cl.
   CPC .......... *G01R 31/382* (2019.01); *H01M 10/48* (2013.01); *H02J 7/0042* (2013.01); *H02J 7/0048* (2020.01); *G01R 31/385* (2019.01); *H02J 7/345* (2013.01)

(56) References Cited

U.S. PATENT DOCUMENTS

| | | | |
|---|---|---|---|
| 5,661,393 A | 8/1997 | Sengupta | |
| 6,242,891 B1 * | 6/2001 | Parsonage | G01R 19/16542 320/132 |
| 6,483,275 B1 | 11/2002 | Nebrigic et al. | |
| 6,950,030 B2 | 9/2005 | Kovarik et al. | |
| 9,496,720 B2 | 11/2016 | McShane | |
| 2003/0124417 A1 * | 7/2003 | Bertness | G01R 31/385 429/90 |
| 2009/0212740 A1 * | 8/2009 | Felps | H01M 10/425 320/134 |
| 2012/0255884 A1 | 10/2012 | McKillip et al. | |
| 2013/0009605 A1 * | 1/2013 | Hongo | H02J 7/0026 320/134 |
| 2013/0307480 A1 * | 11/2013 | Boggs | B60L 58/15 320/118 |
| 2014/0054196 A1 * | 2/2014 | Schaefer | B32B 15/18 206/703 |
| 2016/0006085 A1 * | 1/2016 | Toya | H02J 7/0047 429/90 |
| 2016/0233693 A1 * | 8/2016 | Suzuki | H02J 7/14 |
| 2016/0272341 A1 | 9/2016 | Van Horn et al. | |
| 2017/0229878 A1 * | 8/2017 | Kim | H01M 10/486 |
| 2017/0269162 A1 * | 9/2017 | Thiel | G01R 31/3835 |
| 2019/0199101 A1 * | 6/2019 | Hennesy | H02J 7/00036 |

\* cited by examiner

BATTERY STATE-OF-CHARGE INDICATION

BACKGROUND

The present disclosure relates to indicating a state-of-charge of an electronic charge-storing device, and more specifically, to indicating state-of-charge of an electronic charge-storing device in a container.

SUMMARY

According to embodiments of the present disclosure (hereinafter, "embodiments"), a state-of-charge (SOC) circuit has an SOC indicator circuit, coupled to an SOC indicator, and an SOC threshold circuit. The SOC threshold circuit includes battery contacts to make a continuous contact with respective positive and negative terminals of a battery. The SOC threshold circuit uses the continuous contact to monitor voltage of the battery.

Based on the voltage of the battery, the SOC threshold circuit detects an SOC of the battery greater than a threshold SOC. The threshold SOC corresponds to a minimum SOC of the battery to store the battery in a storage facility or, alternatively, to an SOC of the battery to transport the battery. In response to detecting that the battery has an SOC greater than the threshold SOC, the SOC threshold circuit establishes a state of the SOC indicator corresponding to the battery having an SOC greater than the threshold SOC. In some embodiments, the SOC threshold circuit detects, based on the voltage of the battery, that the battery has an SOC not greater than the threshold SOC. In such embodiments, in response to detecting that the battery has an SOC not greater than the threshold SOC, the SOC threshold circuit establishes a state of the SOC indicator corresponding to the battery having an SOC not greater than the threshold SOC.

In some embodiments, the battery contacts have a respective positive and a negative polarity and the SOC circuit includes a reverse polarity circuit. The reverse polarity circuit detects that the positive polarity battery contact is in contact with the negative terminal of the battery, and that the negative polarity battery contact is in contact with the positive terminal of the battery.

In embodiments, when the SOC circuit detects that the battery has an SOC that is not greater than the threshold SOC, the SOC circuit minimizes discharge of the battery. Also in embodiments, when the SOC circuit detects that the battery has an SOC greater than the threshold SOC, the SOC circuit discharges the battery to an SOC not greater than the threshold SOC. In some embodiments, the threshold SOC corresponds to a governmental regulatory and/or a commercial SOC of a battery.

A container for storing or transporting a battery includes an SOC threshold circuit, an SOC indicator, and a retainer to hold the battery within the container. The SOC indicator is associated with the battery held by the retainer. The SOC threshold circuit comprises battery contacts to make a continuous contact with terminals of the battery. Using the continuous contact, the SOC threshold circuit detects that the battery has an SOC greater than the threshold SOC. The threshold SOC corresponds to an SOC of the battery to store and/or transport the battery. In some embodiments, the threshold SOC corresponds to a governmental regulatory and/or a commercial SOC of a battery. In response, the SOC circuit establishes a state of the SOC indicator to indicate that the battery has an SOC greater than the threshold SOC. The SOC indicator is observable external to the container. In embodiments, the battery can be included in an electronic device, the retainer can hold the electronic device in the container, and the SOC circuit can make a continuous contact with the battery while the battery is installed in the electronic device.

In a method for indicating SOC of a battery, an SOC circuit monitors a voltage of the battery to detect that battery has an SOC greater than a threshold SOC. The threshold SOC corresponds to an SOC of the battery to store or transport the battery, and can further correspond to a governmental regulatory and/or a commercial SOC of a battery. According to the method, in response, the SOC circuit establishes a state of an SOC indicator to indicate that the battery has the SOC greater than the threshold SOC. The method can include the SOC circuit detecting that the battery has an SOC that does not exceed the threshold SOC and, in response, the SOC circuit minimizing discharge of the battery.

The foregoing summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
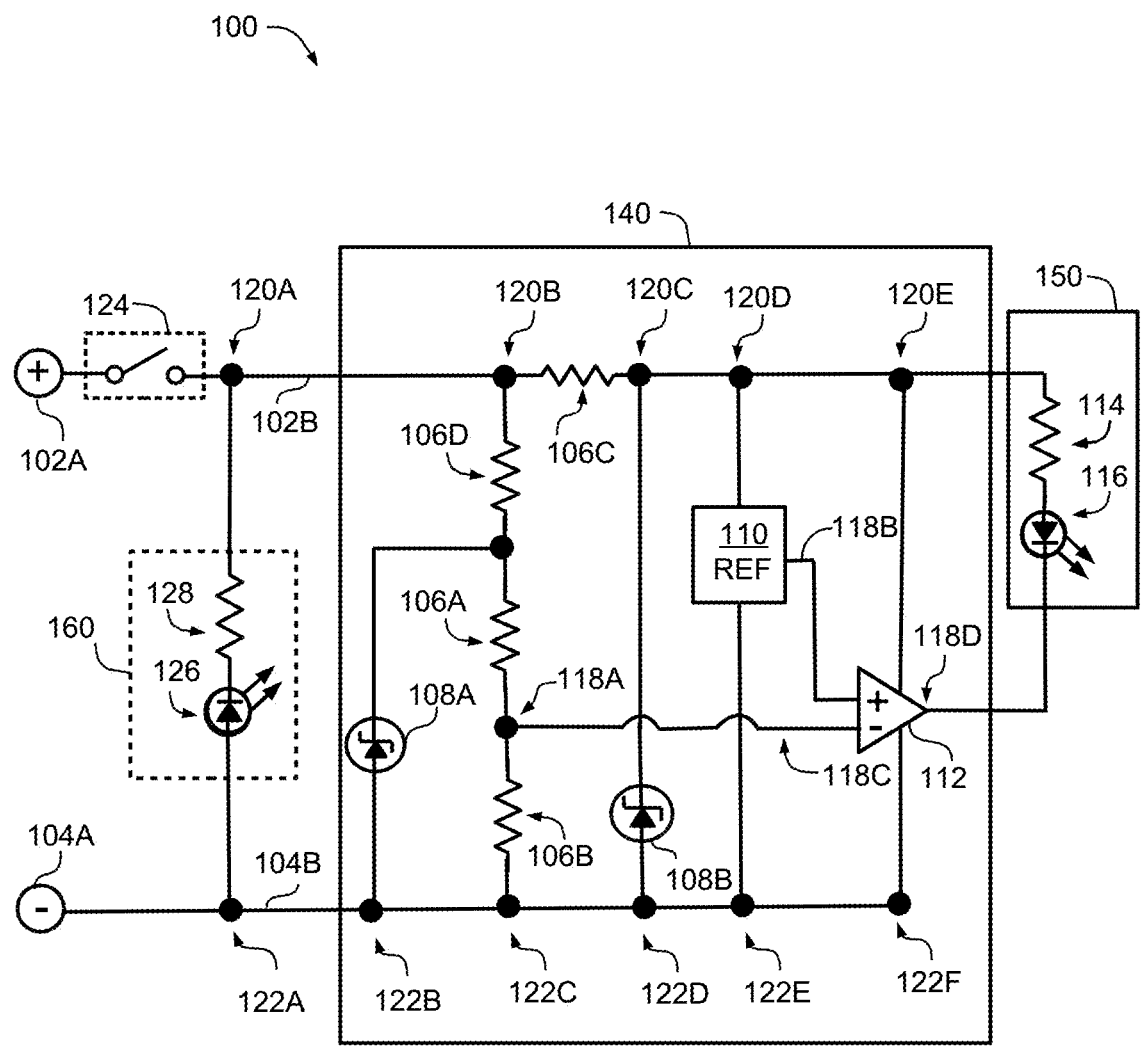
FIG. 1 illustrates an example state-of-charge circuit, according to aspects of the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure (hereinafter, "the disclosure") relate to indicating a state-of-charge of an electric, and/or electronic, device capable of storing electric charge. More particular aspects of the disclosure relate to indicating a particular "threshold" state-of-charge of an electric and/or electronic device capable of storing an electric charge. While the present disclosure is not necessarily limited to such applications, various aspects of the disclosure may be appreciated through a discussion of various examples using this context.

A variety of electric and/or electronic devices are capable of storing an electric charge. Batteries and capacitors, and/or devices that incorporate batteries and/or capacitors are examples of such devices. Batteries can include various battery technologies, such as, for example, but not limited to lithium ion, lithium oxide, alkaline, gel batteries, and wet cell batteries. Electric and/or electronic devices can include or incorporate charge-storing, such as batteries and/or capacitors. Devices that can incorporate batteries include, for example, battery-powered electronic devices such as mobile phones, watches, cameras, and laptop computers. Devices that can utilize capacitors include, for example, camera flash devices; portable or hand-held tools that use capacitors, in lieu of batteries, to power the device; Marx generators; and, pulsed lasers. In general, there are many varieties of devices that can use batteries, capacitors, and/or combinations thereof, to provide electric power to electric or electronic devices.

As used herein, "charge-storing device", refers to any device capable of storing electric charge, including batteries, capacitors, super-capacitors, and/or devices (such as the foregoing examples) that are otherwise capable of storing electric charge, or that utilize devices that store electric charge. It would be apparent to one of ordinary skill in the art that, "battery", or "batteries", as used to describe the ensuing examples of the disclosure, can encompass any type of charge-storing device, and/or devices that utilize and/or otherwise incorporate batteries and/or other charge-storing devices. Accordingly, "battery" is used herein to refer broadly, and interchangeably, to any type of charge-storing device and any type of device that includes, or otherwise incorporates, a charge-storing device, including, but not intended to be limiting to the foregoing examples.

In embodiments of the disclosure (hereinafter, "embodiments"), a state-of-charge (SOC) can correspond to, or be associated with, particular conditions of a battery. For example, a state-of-charge can correspond to a voltage that a battery can provide to an electric or electronic circuit. TABLE 1 illustrates an example of SOC of a battery, expressed as a percent of rated battery charge capacity, corresponding to particular voltages of that battery.

TABLE 1

| Charge Voltage | Percent Charge Capacity |
| --- | --- |
| 4.3 | 106% |
| 4.2 | 100% |
| 4.1 | 89% |
| 4.0 | 73% |
| 3.9 | 62% |
| 3.8 | 30% |
| 3.7 | 8% |
| 3.6 | 5% |
| 3.3 | 0% |

In another example, an SOC can correspond to other characteristics of a battery, such as an SOC that is safe for storing, and/or transporting, a battery. To illustrate, lithium ion batteries can experience failures that "short-circuit" the battery internally, and such internal short circuit failures can ignite the battery. Accordingly, government, and/or commercial, regulations, or practices, can specify a maximum SOC of lithium batteries considered safe for storage and/or transportation of the batteries. For example, a government regulation can limit lithium batteries transported in aircraft to an SOC no greater than 30% of the maximum SOC of the batteries (e.g., 3.8 volts using values in TABLE 1).

To illustrate another example characteristic corresponding to SOC, a battery can require a particular minimum SOC during storage (e.g., while stored in a warehouse, and not installed in an electronic device or connected to a charging device). For example, some batteries can exhibit shortened life cycles if stored for extended periods at low levels of charge. In yet another example, an SOC can correspond to a level of charge of a capacitor used in a Marx generator at which the generator can generate a desired energy pulse, or a level of charge of a capacitor used in a pulsed laser at which the laser emits a light pulse. As used herein, "threshold SOC" refers to an SOC of a particular battery associated with, or corresponding to, a particular characteristic of that battery.

Embodiments can benefit from mechanisms, such as electronic circuitry (hereinafter, "SOC circuitry"), to indicate, for example, that a battery exceeds (or, alternatively, does not exceed, such as is equal to, or less than) a particular "threshold" SOC. For example, embodiments suitable for air transport of lithium ion batteries can utilize SOC circuitry to indicate that each (and/or, all) of the batteries within a shipping container do not exceed a threshold SOC, such as a regulatory limit for air transport.

Voltage indication circuitry can be activated by manual intervention, such as pressing buttons, or pinching tabs or contact points, on a battery package. However, such manual activation can be cumbersome, expensive, and/or inefficient, particularly in applications or environments (e.g., manufacture or shipping) involving a large number of batteries, or devices utilizing or including batteries. Accordingly, it can be advantageous, in embodiments, to indicate the SOC of a battery (e.g., to indicate a threshold SOC, or a variation in SOC of a battery, above or below a threshold SOC) using automatic SOC circuitry that does not require manual interaction.

Automatic SOC circuitry, in embodiments, can make continuous electrical contact between one or more batteries and SOC circuitry. Continuous contact can have an advantage in simplicity (and, possibly, associated cost and/or reliability) in comparison to SOC circuitry that involves, for example, periodic switching of the SOC circuitry among individual batteries, and/or sets of batteries. For example, an embodiment can comprise a shipping (and/or a storage) container for lithium ion batteries and SOC circuitry to continuously indicate that the batteries within the container exceed (or, alternatively, do not exceed) a regulatory SOC (for example, 30% SOC). In such an embodiment, SOC circuitry can be in continuous electrical contact with each battery in the container.

However, it can be undesirable, and/or disadvantageous, for embodiments to discharge a battery below a desirable, or required, SOC (e.g., an SOC less than a regulatory maximum SOC, but not less than an SOC desired for storing or shipping) while the battery is in contact with SOC circuitry. For example, it can be desirable to store or receive (e.g., from transit) a battery at an SOC close to a threshold SOC while SOC circuitry is in continuous contact with the battery during storage or transit. Accordingly, it can be further advantageous, in embodiments, to minimally discharge the battery when the battery voltage is less than a threshold (e.g., regulatory limit) SOC voltage or, alternatively, a particular SOC less than the threshold SOC.

For example, a current of about 7 microamperes sourced by a typical lithium cell battery can correspondingly require about 12 years to deplete the battery charge from an initial SOC of 30%. In embodiments, SOC circuitry can be in contact with a battery for periods of days, weeks, months, or even several years for storage or transport. Limiting discharge current, in embodiments, while in contact with the cell can comprise minimally discharging the battery from an SOC below a threshold SOC, in comparison to the time to fully discharge that battery at the limited discharge current. As used herein, "minimally discharging" a battery refers to discharging the battery so as to not substantially alter the SOC of the battery, below a particular SOC, over a period of time that an embodiment is in continuous contact with the battery.

FIG. 1 illustrates example SOC circuit 100, which can indicate (e.g., visually, using light) that the SOC of a battery exceeds (e.g., is greater than) a particular threshold SOC. Further, SOC circuit 100 in continuous contact with the battery can minimally discharge the battery when the battery is at an SOC below the threshold SOC.

For purposes of illustrating the examples of the disclosure, but not intended to limit embodiments, connecting a battery to an SOC circuit comprises connecting positive and negative polarity terminals of the battery to corresponding circuit contacts of an SOC circuit. As used herein, and for only purposes of describing the example embodiments of the disclosure, but not intended to limit embodiments, "normal polarity" refers to a configuration of a battery connected to an SOC circuit in which the battery positive and negative polarity terminals are connected, respectively, to corresponding positive and negative contacts of an SOC circuit (e.g., battery positive to SOC circuit positive, and battery negative to SOC circuit negative). Further, as used herein, and also for only purposes of describing the example embodiments of the disclosure, but not intended to limit embodiments, "reverse" polarity refers to a configuration of a battery connected to an SOC circuit in which the battery positive and negative polarity terminals are connected, respective opposite polarity contacts of an SOC circuit (e.g., battery positive to SOC circuit negative, and battery negative to SOC circuit positive).

Example SOC circuit 100 comprises SOC circuit contacts 102A and 104A connecting to respective wires 102B and 104B SOC threshold circuit 140; SOC indicator circuit 150; and, optionally, polarity detection circuit 160. In embodiments, contacts 102A and 104A can have, respectively, positive and negative polarities, and can be configured to connect to polarity contacts (e.g., positive and negative terminals) of a battery. In embodiments, an SOC circuit can compare the voltage of a battery, connected between a positive and negative contact of the SOC circuit, to a reference voltage to determine if the battery is at an SOC that does or, alternatively, does not, exceed a threshold SOC.

To illustrate, example SOC threshold circuit 140 comprises resistors 106A and 106B, voltage reference 110, and operational amplifier 112 that can compare the voltage of a battery, connected to 102A and 104A, to a reference voltage to determine if the battery is at an SOC less than a threshold SOC. Voltage reference 110 is shown connected to wires 102B and 104B at 120D and 122E, respectively, and can output (e.g., on wire 118B) a voltage corresponding to a threshold SOC voltage (e.g., a voltage corresponding to 30% SOC of a battery). In embodiments, voltage reference 110 can be, for example, a voltage regulator.

Resistors 106A, 106B, and 106D are shown connected in series between wire 104B at respective connections 120B and 122C. In embodiments, the series connection of 106A and 106B can operate, at connection 118A, as a voltage divider and the voltage at 118A can vary in correspondence to the SOC of a battery connected in normal polarity at 102A and 104A. The relative values of resistors 106A and 106B can be selected such that the voltage at 118A matches the reference voltage output by voltage reference 110, on wire 118B, when the battery has the threshold SOC.

In embodiments, in response to a voltage (e.g., a voltage corresponding to a battery SOC) that exceeds a voltage corresponding to a particular SOC (e.g., a threshold SOC), an SOC threshold circuit, such as 140, can activate an SOC indicator circuit, such as 150. Activating the SOC indicator circuit can cause the SOC indicator circuit to turn on an indicator (e.g., illuminate a light or a display, emit an audible sound, etc.). Similarly, in embodiments, in response to a voltage (e.g., a voltage corresponding to a battery SOC) that does not exceed a voltage corresponding to a particular SOC (e.g., a threshold SOC), an SOC threshold circuit, such as 140, can deactivate an SOC indicator circuit, such as 150. Deactivating the SOC indicator circuit can cause the SOC indicator circuit to turn off an indicator (e.g., turn off a light or a display, not emit an audible sound, etc.).

To illustrate, in SOC threshold circuit 140, operational amplifier 112 connects between wires 102B and 104B at 120E and 122F, respectively, and, by means of these connections, can receive operating power from a battery connected at 102A and 104B. Operational amplifier 112 receives the voltage divider voltage at 118A by means of wire 118C connecting to a negative input of operational amplifier 112, and receives the reference voltage from voltage reference 110 by means of wire 118B connecting to a positive input of operational amplifier 112. SOC indicator circuit 150 comprises resistor 114 and light-emitting diode (LED) 116 connected in series between wire 102B and operational amplifier 112 output 118D. Based on the comparative input voltages received from 118B and 118C, operational amplifier 112 can permit sufficient current to flow between 120E and 118D, through resistor 114 and LED 116, to light LED 116, thereby activating SOC indicator circuit 150. Also, based on the comparative input voltages received from 118B and 118C, operational amplifier 112 can limit current flow between 120E and 118D, through resistor 114 and LED 116, to a current insufficient to light LED 116, thereby deactivating SOC indicator circuit 150.

For example, if the voltage received from 118C (corresponding to the voltage divider voltage at 118A) exceeds the reference voltage received from 118B, the operational amplifier can present a voltage, at 118D, approaching the battery negative voltage, present at 122F on wire 104B, such that there is sufficient current through LED 116 to light LED 116, thereby activating SOC indicator circuit 150. Alternatively, if the voltage received from 118C (corresponding to the voltage divider voltage at 118A, which in turn corresponds to an SOC of the battery) does not exceed the reference voltage received from 118B, the operational amplifier can present a voltage, at 118D, approaching the battery positive voltage, present on wire 102B at 120E, such that there is insufficient current through LED 116 to light the LED, thereby deactivating SOC indicator circuit 150. As illustrated by example SOC circuit 100, embodiments can provide a visual indication that a battery SOC exceeds a threshold SOC by illuminating an LED (e.g., LED 116), and/or that a battery as at an SOC that does not exceed a threshold SOC by not illuminating an LED (e.g., LED 116).

In embodiments, resistor 114 of example of SOC circuit 100 can operate to limit current through LED 116, and/or to dissipate power, to avoid reducing the operating life of LED 116 (e.g., such that LED 116 does not burn out unduly quickly), when a battery connected to SOC circuit 100 exceeds the threshold SOC and LED 116 is activated (e.g., illuminated). Also in embodiments, resistor 114 can be selected to discharge a battery, connected to the SOC circuit, to an SOC at or below a threshold SOC when that battery has a charge above the SOC threshold and the SOC circuit activates LED 116. It would be apparent to one of ordinary skill in that art that other modifications to SOC circuit 100 are possible to discharge a battery to, or below, a threshold SOC, when that battery has an SOC above the threshold SOC.

As previously described, in embodiments the components of an SOC circuit, such as 100, can be selected to minimally discharge a battery connected to the SOC circuit. For example, resistors 106A and 106B, voltage reference 110, and/or operational amplifier 112 can be selected such that when a battery connected at 102A and 104A is at an SOC that does not exceed a threshold SOC (corresponding to the reference voltage at 118B), the current through these components minimally discharges the battery (e.g., these components draw less than about 7 microamperes from a lithium cell battery at or below 30% SOC).

In embodiments, it can be desirable to enable an SOC circuit to monitor a battery for one period of time (e.g., while in transit), and disable the SOC circuit monitoring the battery at other times (e.g., while in storage awaiting transit). Accordingly, FIG. 1 illustrates SOC circuit 100 having optional switch 124, that can be manually or, alternatively, automatically (by any appropriate automated mechanism) activated to enable the circuitry of SOC circuit 100 to complete a connection to a battery between 102A and 104A. When open, switch 124 breaks wire 102B to disconnect components of SOC circuit 100 from the battery.

As illustrated, SOC circuit 100 can monitor SOC of a battery when the battery is connected in normal polarity. However, a battery can be erroneously connected to SOC circuit 100 in reverse polarity (i.e., battery positive terminal to 104A and battery negative terminal to 102A). Accordingly, embodiments can optionally include reverse-bias protection for components of an SOC circuit, such as diodes 108A and/or 108B, connected to wire 104B at 122B and 122D, respectively, that can provide reverse-bias protection for components of SOC circuit 100 (e.g., voltage reference 110 and/or operational amplifier 112). Resistor 106 connects to diode 108B on wire 102B between connections 120B and 120C and, in embodiments, can operate to prevent a short circuit through a battery connected in reverse polarity to 102A and 102B. Resistor 106D connects between diode 108A and wire 102B also to provide reverse bias protection to components of 140.

Additionally, it can be advantageous, in embodiments, to indicate (e.g., to a human connecting a battery to an SOC circuit) that a battery is connected to an SOC circuit in reverse polarity. Accordingly, FIG. 1 illustrates SOC circuit 100 having optional polarity detection circuit 160, comprising LED 126 and resistor 128 connected between 104A and 102A at 122A and 120A, respectively. If a battery is connected in reverse polarity to SOC circuit 100, and SOC circuit 100 includes polarity detection circuit 160, then the reverse polarity connection to the battery can illuminate LED 126 to indicate the reverse polarity connection.

Embodiments of a polarity detection circuit can include other means of indicating a reverse polarity of a battery connected to an SOC circuit (e.g., 100). For example, a polarity detection circuit, such as 160, can include a speaker, and the speaker can be included in addition to, or in place of, LED 126 and/or resistor 128. The speaker can provide an audible indication that a battery is connected to SOC circuit 100 in reverse polarity. However, these examples are not intended to be limiting to embodiments, and it would be apparent to one of ordinary skill in the art that various circuits and/or device types can be included in a polarity detection circuit that can indicate that a battery is connected to the SOC circuit in reverse polarity.

Alternative embodiments of an SOC circuit can monitor the SOC of a battery connected to the circuit independent of the polarity of the connections between the battery and the SOC circuit. To illustrate, in FIG. 2 example SOC circuit 200 comprises SOC threshold circuit 240 in combination with SOC threshold circuit 140 and SOC indicator circuit 150 of SOC circuit 100 of FIG. 1. In embodiments, an SOC circuit, such as 200, can indicate that a battery SOC exceeds (or, does not exceed) a threshold SOC when the battery is connected in either normal or reverse polarity with respect to the polarities of SOC circuit contacts.

SOC circuit 200 comprises circuit contacts 202A and 204A connecting to respective wires 202B and 204B, SOC threshold circuit 240, and SOC indicator circuit 250. SOC circuit 200 further comprises SOC threshold circuit 140, of example SOC circuit 100 in FIG. 1, connected to wire 202B at 220A and to wire 204B at 222A, and SOC indicator circuit 150 of example SOC circuit 100. In SOC circuit 200, SOC threshold circuit 140 connects to SOC indicator circuit 150, which can be as illustrated in FIG. 1 by connections 120E and 118D. In the case of a battery connected by its positive terminal to 202A and its negative terminal to 204A (which can be considered, for the purposes of example SOC circuit 200, to be normal polarity), SOC threshold circuit 140 and SOC indicator circuit 150 can operate, in SOC circuit 200, to indicate that a battery connected in normal polarity exceeds or, alternatively, does not exceed an SOC threshold voltage, in the same manner as just described in reference to FIG. 1.

In SOC threshold circuit 250, for the case of a battery connected by its positive polarity terminal to 204A and its negative polarity terminal to 202A (which can be considered, for purposes of the example of FIG. 2, to be reverse polarity), resistors 208A and 208B, voltage reference 210, operational amplifier 212, and resistor 214 and LED 216 can operate in a manner similar to that previously described in reference to FIG. 1 regarding resistors 106A and 106B, voltage reference 110, operational amplifier 112, and resistor 114 and LED 116 of SOC circuit 100.

Figure 2:
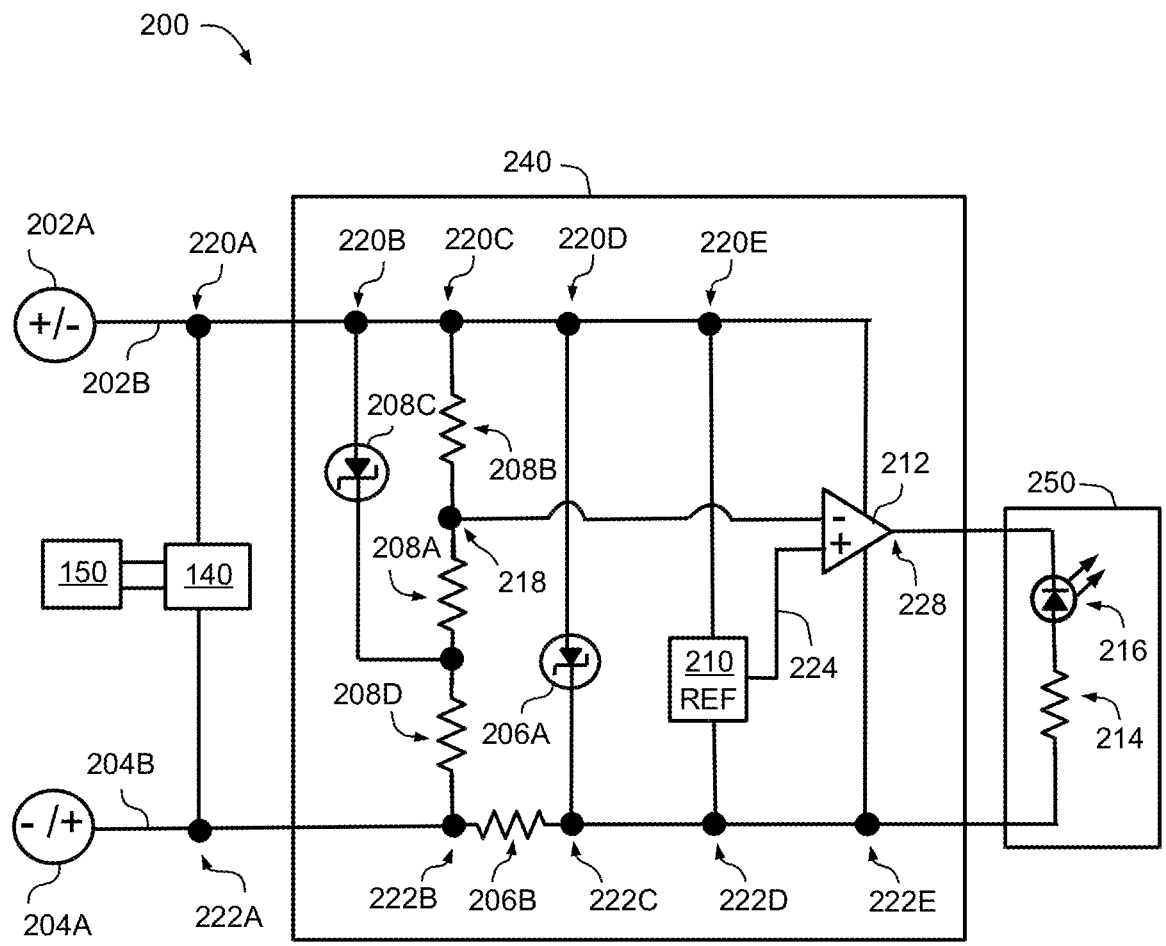
FIG. 2 illustrates an alternative example state-of-charge circuit, according to aspects of the disclosure.

Voltage reference 210, in FIG. 2, connects between wires 202B and 204B at 220E and 222D, respectively, and can output, at 224, a reference voltage corresponding to a threshold SOC of a battery. Resistors 208A, 208B, and 208D connect in series to wires 202B and at 220C and 228B, respectively. Resistors 208A and 208B can be selected to present a voltage, at 218, that corresponds to the reference voltage, output by voltage reference 210 at 224, when the battery positive polarity is connected to 204A and battery negative polarity is connected to 202A, and the battery is at an SOC corresponding to the threshold SOC. Operational amplifier 212 connects between wires 202B and 204B at 220E and 222E, respectively, and can thereby receive operating power from the battery. Operational amplifier 212 can receive the reference voltage (from 224) at a positive input and a voltage corresponding to the SOC voltage of the battery at 218 at a negative input and can compare the voltages.

SOC indicator circuit 250 comprises resistor 214 and LED 216 connected in series to wire 202B, at 222E, and to output 228 of operational amplifier 212. Similar to example SOC circuit 100 of FIG. 1, if the voltage received from 218 (corresponding to the SOC of the battery) does not exceed the reference voltage received from 224, the operational amplifier can present a voltage, at 228, approaching the battery positive voltage, present on wire 204B at 222E, such that there is insufficient current through LED 216 to light the LED, thereby deactivating SOC indicator circuit 250. Alternatively, if the voltage received from 218 exceeds the reference voltage received from 224, the operational amplifier can present a voltage, at 228, approaching the battery negative voltage (e.g., the SOC circuit 200 ground voltage), present on wire 202B at 220E, such that there is sufficient current through LED 216 to light the LED, thereby activating SOC indicator circuit 250.

Similar to example SOC circuit 100 of FIG. 1, SOC circuit 200 in FIG. 2 includes optional diodes 206A and 208C, connected to wire 202B at 220B and 220D, respectively, and can operate, in embodiments, to provide reverse-bias protection for components of SOC threshold circuit 240. Additionally, in SOC circuit 200, resistor 206B, connected on wire 204B between 222B and 222C can operate to protect a battery connected in normal polarity from a short circuit through SOC threshold circuit 240, similar to the previous description of resistor 106C in reference to FIG. 1. Resistor 208D connects between diode 208C and wire 204B also to provide reverse bias protection to components of 240.

While not shown, in embodiments, an SOC circuit can optionally include a switch, such as switch 124 in SOC circuit 100 of FIG. 1, that can operate to connect or disconnect one of the SOC circuit contacts from the battery by making or breaking contact with a corresponding wire of the circuit similar to the manner of switch 124 in FIG. 1. For example, a switch similar to 124 of SOC circuit 100 can be connected between 204A and 222A, and opening the switch can disconnect the battery from SOC circuit 200.

As previously described in reference to FIG. 1, in embodiments the components of an SOC circuit, such as 200, can be selected to minimally discharge a battery connected to the SOC circuit. For example, resistors 206B, 208A, 208C, 208D, voltage reference 210, and/or operational amplifier 212, and/or components of SOC threshold circuit 140 as included in SOC circuit 200, can be selected such that when a battery connected at 202A and 204A is at an SOC that does not exceed a threshold SOC corresponding to the reference voltage at 224, the current through these components minimally discharges the battery (e.g., these components can draw less than about 7 microamperes from a lithium ion battery at or below 30% SOC).

Also, as previously described in reference to SOC circuit 100 of FIG. 1, resistor 214 can operate to limit current through LED 216 and dissipate power, and/or to discharge a battery connected, in reverse polarity, at 202A and 204A to SOC circuit 200, to an SOC at or below a threshold SOC, when that battery has an SOC above the threshold SOC. Similarly, components of SOC indicator circuit 150, as included in SOC circuit 200, can operate to limit current through an indicator LED and dissipate power, and/or to discharge a battery connected in normal polarity, at 202A and 204A to SOC circuit 200, to an SOC at or below a threshold SOC, when that battery has an SOC above the threshold SOC. It would be apparent to one of ordinary skill in that art that other modifications to SOC circuit 200 are possible to discharge a battery to (or, below) a threshold SOC when that battery has an SOC at or above the threshold SOC.

Figure 3:
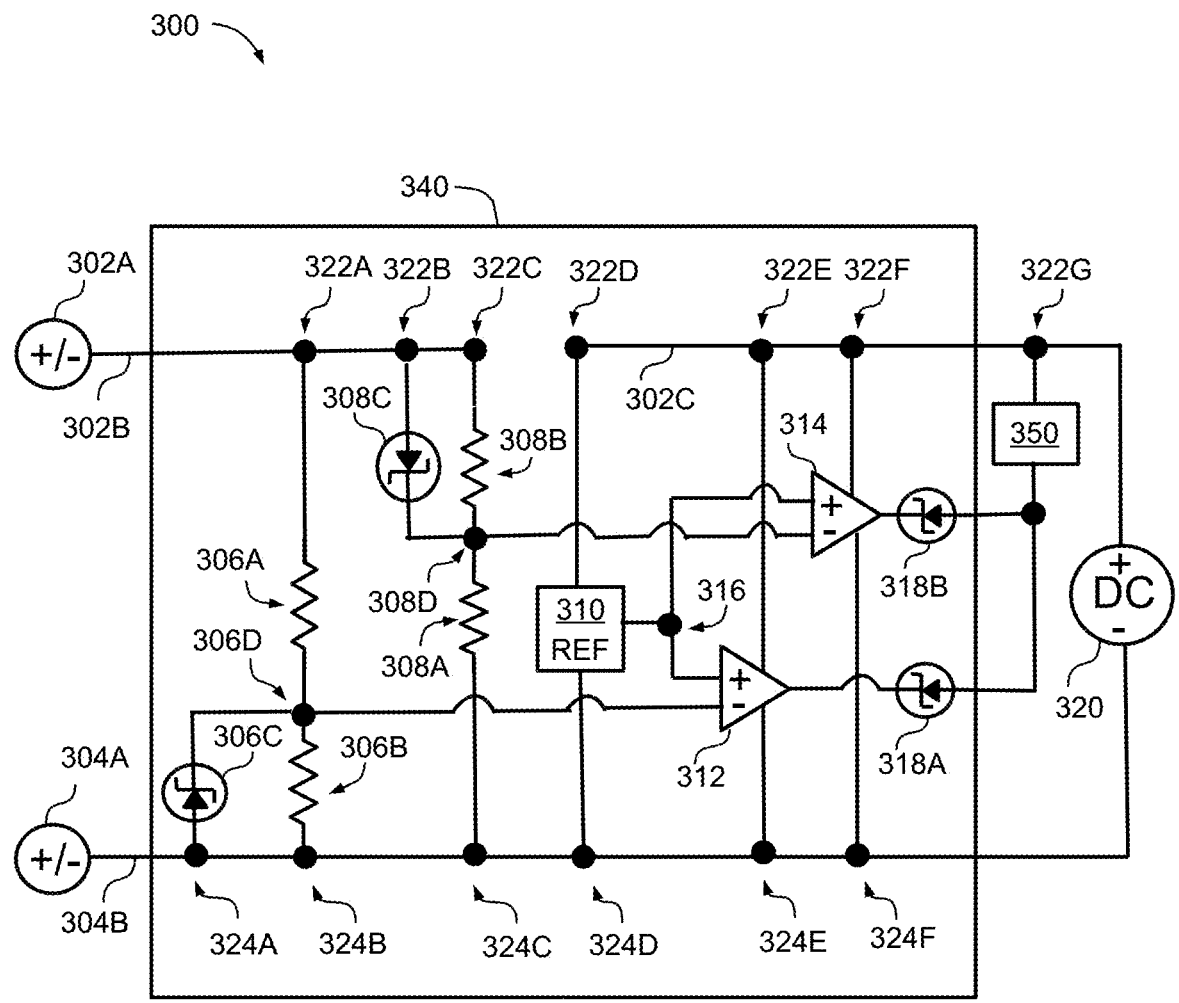
FIG. 3 illustrates a second alternative example state-of-charge circuit, according to aspects of the disclosure.

Embodiments can further reduce discharge of a battery connected to an SOC circuit by including an alternative power source for the SOC circuit, so as to further reduce current drawn from the battery to operate components of the SOC circuit. FIG. 3 uses the example of SOC circuit 200 modified to include an auxiliary power source to provide operating power to some elements of the SOC circuit.

In FIG. 3, SOC circuit 300 comprises SOC threshold circuit 340 including an auxiliary DC power source, 320, which can provide operating power to components of SOC circuit 300. As shown in FIG. 3, SOC circuit 300 comprises circuit contacts 302A and 304A connecting to wires 302B and 304B, respectively. Components of SOC threshold circuit 340 connect to wires 302B, 304B, and 302C.

SOC threshold circuit 340 includes resistors 306A and 306B, connected in series to wires 302B and 304B at 322A and 324B, respectively. SOC threshold circuit 340 further includes resistors 308A and 308B, connected in series to wires 302B and 304B at 322C and 324C, respectively. In embodiments, as previously described in reference to FIG. 1, resistors 306A and 306B can operate to present a voltage, at 306D corresponding to an SOC of a battery connected in normal polarity to 302A and 304A (for purposes of illustrating the example of FIG. 3, battery positive terminal to 302A and battery negative terminal to 304A). Similarly, as previously described in reference to FIG. 2, resistors 308A and 308B can operate to present a voltage, at 308D corresponding to an SOC of a battery connected in reverse polarity to 302A and 304A (for purposes of illustrating the example of FIG. 3, battery negative terminal to 302A and battery positive terminal to 304A).

Wire 302C connects to a positive polarity output of DC power source 320 at 322G, and wire 304B connects to a negative polarity output of DC power source 320 at 324F. In embodiments, DC power source 320 can provide operating power to components connecting between positive polarity wire 302C and negative polarity wire 304B, such that these components of SOC circuit 300 do not draw power from the battery connected to SOC circuit 300 at 302A and 304A.

To illustrate, in SOC threshold circuit 340, voltage reference 310 can provide, at 316, a voltage corresponding to a particular battery SOC (e.g., a threshold SOC) and can provide this reference voltage to positive inputs of operational amplifiers, such as 312 and 314 in SOC threshold circuit 340. Operational amplifiers 312 and 314 receive, at respective negative inputs, the voltage present at 306D and 308D, respectively, which can (in embodiments) correspond to an SOC of a battery connected at 302A and 304A of SOC circuit 300.

In embodiments, operational amplifiers 312 and 314 can compare the negative input voltages received from 306D and 308D, respectively, with the reference voltage received from 316, such as in the manner previously described with reference to FIGS. 1 and 2. Operational amplifier 312 can operate to compare the reference voltage to an SOC voltage of a battery (at 306D) connected to SOC circuit 300 in normal polarity, and operational amplifier 314 can operate to compare the reference voltage to an SOC voltage of a battery (at 306D) connected to SOC circuit 300 in reverse polarity.

SOC circuit 300 further comprises SOC indicator circuit 350, which can be similar to the example of SOC indicator circuit 150 of FIG. 1. In the case of a battery connected to SOC circuit 300 in normal polarity, operational amplifier 312 can operate to permit a current through an LED included in SOC indicator circuit 350 to indicate that the battery exceeds an SOC (e.g., a threshold SOC) corresponding to the reference voltage. Additionally, or alternatively, in the case of a battery connected to SOC circuit 300 in normal polarity, operational amplifier 312 can operate to limit a current through an LED included in SOC indicator circuit 350 to indicate that the battery does not exceed an SOC corresponding to the reference voltage. Operational amplifier 314 can operate in a similar manner in the case of a battery connected to SOC circuit 300 in reverse polarity.

SOC threshold circuit 340 also includes diode 306C, connected to wire 304B at 324A, and diode 308C connected to wire 302B at 322B. As previously described in reference to FIGS. 1 and 2, diodes 306C and 308C can operate, in embodiments, to provide reverse bias protection to other components of SOC threshold circuit 340 (e.g., operational amplifiers 312 and 314). Additionally, SOC threshold circuit 340 includes diodes 318A and 318B to isolate respective operational amplifiers 312 and 314 from indicator circuit 350 when a battery is connected to contacts 302A and 304A in a polarity opposite of the positive polarity to which operational amplifiers 312 and 314 are connected (302A operating as battery positive polarity for 312, and 304A operating as battery positive polarity for 314).

In SOC circuit 300, as previously discussed, DC power source 320 can provide operating power to components of SOC threshold circuit 340 connected to wires 302C and 304B, and/or to other components connected to wires 302C and 304B. Voltage reference 310 connects to wires 302C and 304B at 322D and 324D, respectively. Similarly, operational amplifiers 312 and 314 connect to wires 302C and 304B at respective connections points 322E and 324E, and 322F and 324F. Accordingly, in SOC circuit 300 voltage reference 310 and operational amplifiers 312 and 314, can receive operating power from DC power source 320 and, correspondingly, can avoid drawing power from a battery connected to SOC circuit 300.

DC power source 320 can be any of a variety of power sources, such as other batteries, a DC power transformer connected to an AC power source, or any DC power source that can provide proper voltage and sufficient current to provide operating power to the components of an SOC circuit such as the example of SOC circuit 300. Additionally, while not shown in FIG. 3, in embodiments DC power source 320 can connect to multiple instances of SOC circuits similar to 300. For example, DC power source 320 can, in embodiments, connect to one or more additional SOC circuits, each having components of SOC circuit 300 connected between wires 302 and 204B, and sharing a connection to DC power source 320. For example, a shipping container for a plurality of batteries can include an SOC circuit, such as 300, for each battery within the container, and multiple such batteries and SOC circuits such as 300 can connect to a single DC power source, such as 320, at 322G and 324F of each SOC circuit.

Similar to the previous description of SOC circuit 200, in FIG. 2, embodiments of an SOC circuit, such as 300, can select resistors 306A, 306B, 308A, and/or 308B, in FIG. 3, such that they can operate to discharge a battery, connected at 302A and 304A to SOC circuit 300, to an SOC less than or equal to a threshold SOC when that battery has an SOC above the threshold SOC (or, alternatively, discharge the battery to the threshold SOC, when the battery has an SOC greater than the threshold SOC). It would be apparent to one of ordinary skill in that art that other modifications to SOC circuit 300 are possible to discharge a battery to (or, below) a threshold SOC when that battery has an SOC above the threshold SOC.

As previously described in reference to SOC circuit 100 of FIG. 1 and SOC circuit 200 of FIG. 2, embodiments of an SOC circuit such as 300 can optionally include a switch (e.g., similar to 124 of SOC circuit 100), such as between connections 302A and 322A of SOC circuit 300, to periodically connect or disconnect a battery to the SOC circuit. Similarly, embodiments can optionally include a switch (e.g., similar to 124 of SOC circuit 100), such as between connection 322G of SOC circuit 300 and the positive polarity output of DC power source 320, to periodically connect or disconnect DC power source 320 to SOC circuit 300. Optionally, in embodiments of an SOC circuit such as 300, a single-pole double-throw switch can, at 302A and 322G, for example, substitute for two individual switches operating at 302A and 322G.

Figure 4:
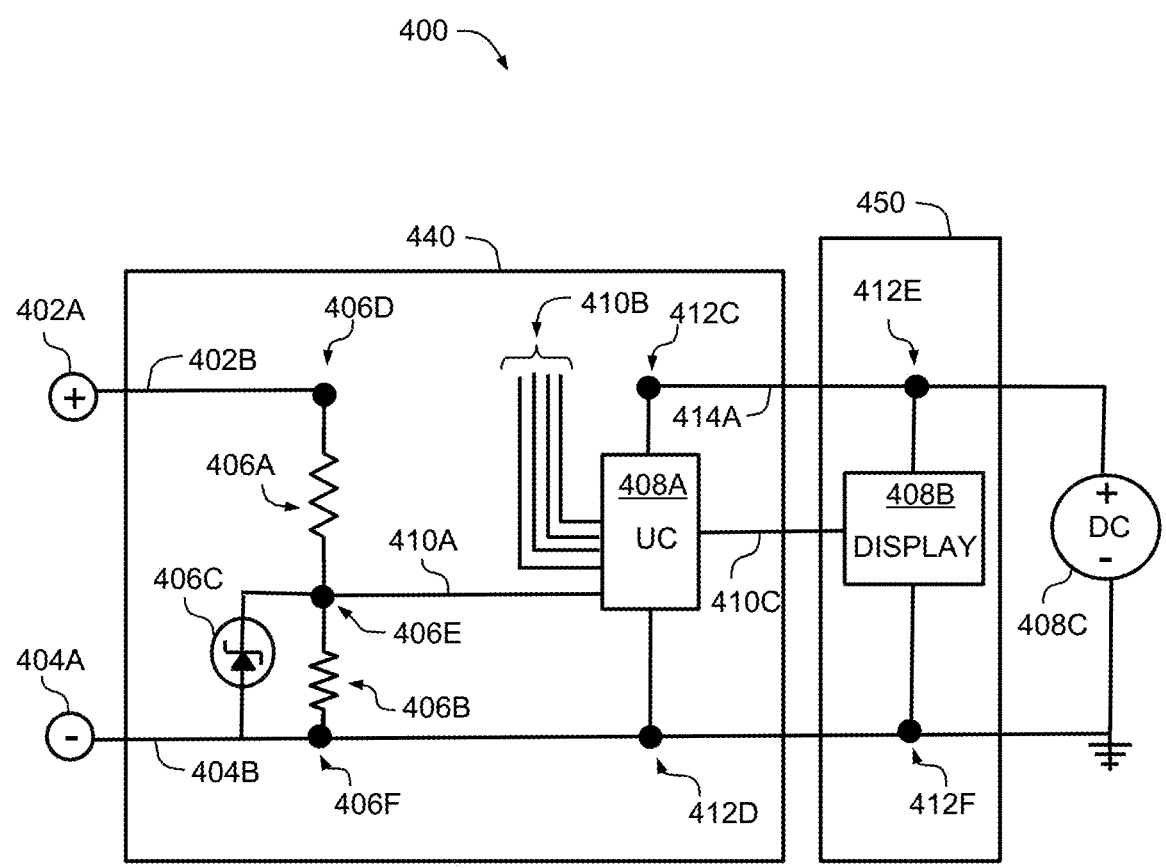
FIG. 4 illustrates a third alternative example state-of-charge circuit according to aspects of the disclosure.

In other embodiments, an SOC circuit can utilize a micro-controller to monitor SOC of one or more batteries. FIG. 4 illustrates example SOC circuit 400 utilizing a microcontroller to monitor SOC of a plurality of batteries. An SOC circuit, such as 400, can be integrated, for example, in a shipping container for a plurality of batteries and can monitor SOC of a set of the batteries within the container.

In FIG. 4, SOC circuit 400 comprises contacts 402A and 404A, connecting to respective wires 402B and 404B; SOC threshold circuit 440; and, SOC indicator circuit 450. In embodiments, contacts 402A and 404A can have, respectively, positive and negative polarities, and can be configured to connect to corresponding positive and negative polarity contacts (e.g., positive and negative terminals) of a battery. Wire 404B can operate as a common ground (or, negative polarity) for components of SOC circuit 400.

SOC threshold circuit 440 comprises resistors 406A and 406B, connected in series to wires 402B and 404B at respective connections 406D and 406F, and micro-controller 408A. Micro-controller 408A connects to wire 414A at 412C, and to wire 404B at 412D. SOC indicator circuit 450 comprises display 408B, which connects to wire 414A at 412E and to wire 404B at 412F. Similar to SOC circuits 100, 200, and 300, diode 406C is optional and can provide reverse-bias protection for components of SOC threshold circuit 440, such as micro-controller 408.

As previously described in reference to SOC circuit 300 of FIG. 3, in embodiments an SOC circuit can include an auxiliary power source to provide power to components of the SOC circuit. To illustrate, example SOC circuit 400 further comprises DC power source 408C, which can provide power to components of SOC threshold circuit 440 and SOC indicator circuit 450 by means of connections to wires 414A and 404B (e.g., at 412E and 412F, respectively).

As previously described in reference to the example SOC circuits of FIGS. 1, 2, and 3, in embodiments, the series connection of 406A and 406B, between respective connections 406D and 406F, can operate, at 406E, as a voltage divider and the voltage at 406E can vary in correspondence to the SOC of a battery, connected in normal polarity to 402A and 404A. In embodiments, a micro-controller, such as 408A, can receive a voltage input and monitor the voltage input values in comparison to voltage values corresponding to particular SOC values of a battery, or type of battery.

To illustrate, in SOC threshold circuit 440 micro-controller 408A connects by means of input wire 410A to 406E. Micro-controller 408A can thereby receive a voltage, from 406E, that can correspond to an SOC of a battery connected at 402A and 404A. Micro-controller 408 can be programmed with one or more reference voltages corresponding to particular SOC values (e.g., a threshold SOC) of a battery (or, alternatively, a particular type of battery or charge-storage device) and can compare the input voltage on 410A to these reference voltages. Based on the comparison, micro-controller 408A can determine if a battery, connected at 402A and 404A, has an SOC that exceeds a threshold SOC.

As further illustrated in FIG. 4, micro-controller 408 can receive, by means of input wires 410B, voltages from batteries connected to additional SOC circuits. For example, additional SOC circuits can comprise SOC circuit contacts connecting each SOC circuit to a battery, and voltage dividers having SOC voltage connections corresponding to 406E, and those corresponding SOC voltage connections can be connected to inputs among 410B. Micro-controller 408 can compare these additional voltages to a voltage corresponding to a threshold SOC of a battery (or, alternatively, a particular type of battery or charge-storage device). Accordingly, micro-controller 408 can determine if one or more of these additional batteries has an SOC that exceeds the threshold SOC.

In embodiments, micro-controller 408A can monitor voltage inputs to determine other SOC characteristics of batteries connected to SOC circuits that input to the SOC monitor circuit micro-controller. For example, the micro-controller can monitor input voltages to determine if a battery (connected to an SOC circuit input to the micro-controller) has an SOC that is too high (e.g., greater than 100%) or too low (near 0%) for, or an SOC (e.g., less than 5%) that can damage, a battery of a particular type.

SOC threshold circuit 440 can output SOC information to SOC indicator circuit 450 as output from micro-controller 408 to display 408B on interface 410C, thereby activating SOC indicator circuit 450. The information can include status (e.g., less than, at, and/or above a threshold SOC), and/or a SOC, of each of the batteries connected to inputs (e.g., 410A and/or 410B) of the micro-controller, and display 408B can display the status and/or SOC values visually. Micro-controller 408 can output error information to display 408B, such as error information associated with the SOC voltages received at inputs (e.g., 410A and/or one or more of 410B), and/or associated with SOC threshold circuit 440.

In embodiments, display 408B can be any type of visual display, such as an LCD screen, color electronic display, or, for example, a set of LEDs (each of the same, or alternatively, different color light), each corresponding to one or more of the batteries, or corresponding to a state (e.g., at or above a threshold SOC) of one or more of the batteries. Also, in embodiments, interface 410C can be a wire, or set of wires (e.g., a data bus); a network interface; or a communications interface. It would be apparent to one of ordinary skill in the art that interface 410C can comprise any interface suitable for a micro-controller to communicate information including and/or related to a battery SOC to a device capable of displaying the information, and according to the type and/or content of the information and/or type or manner of operation of the display device.

In embodiments, micro-controller 408A can include a sleep mode, and can enter sleep mode whenever it determines that no voltage inputs to micro-controller 408A represent a battery at or above (or, alternatively, all voltage inputs represent all batteries below) an SOC threshold. Also, in embodiments, micro-controller 408A can include adjustable SOC thresholds, such as an SOC threshold corresponding to one type of battery and a different SOC threshold corresponding to a different type of battery. In another example, micro-controller 408A can have thresholds to output information or activate an indicator circuit in which the thresholds correspond to an amount of time the batteries have been monitored, or to temperatures at which the batteries have been monitored. It would be apparent to one of ordinary skill in the art that a micro-controller can apply a variety of adjustable SOC or other thresholds to various applications and/or environmental conditions of batteries and/or battery types.

While the foregoing example SOC indicator circuits of FIGS. 1-4 utilize visual indicators (LEDs and a display) to indicate an SOC of a battery above a threshold SOC, this is not intended to limit embodiments. It would be apparent to one of ordinary skill in the art that embodiments can utilize indicators other than visual indicators. For example, in place of, or in addition to, a visual indicator, an SOC indicator circuit can utilize an auditory indicator, such as a buzzer or alarm, that can generate a tone, or series of tones, when a battery is above a threshold SOC. In another example, an SOC indictor circuit can connect to a communications network and transmit a network signal and/or data communication (e.g., transmit a message to a mobile device via a wireless network) to indicate a battery above a threshold SOC.

Additionally, the example SOC circuits of FIGS. 1-4 illustrate particular implementations of SOC threshold and SOC indicator circuits, but these are not intended to limit embodiments. It would be apparent to one of ordinary skill in the art that embodiments can implement particular electronic circuits, other than these examples, to perform the functions of an SOC threshold circuit to determine that a charge-storing device has an SOC that exceeds (or, alternatively, does not exceed) a particular SOC, or to otherwise determine or monitor the SOC of a charge-storing device, and/or to perform the functions of an SOC indicator circuit in response to an SOC threshold circuit activating (or, alternatively, deactivating) of the SOC indicator circuit.

It would further be apparent to one of ordinary skill in the art that embodiments can couple an SOC indicator circuit to an SOC threshold circuit in manners other than shown in FIGS. 1-4. For example, in another embodiment, SOC threshold circuit 140 can activate (or, deactivate) SOC indicator circuit 150 in response to operational amplifier 112 determining a voltage difference between inputs 118A and 118B by means other than connections 120E and 122F, such as using a relay, or other circuit or device, to enable or limit current through SOC indicator circuit 150.

Embodiments can be battery containers (e.g., for storage or transport), and/or battery packages (e.g., for inclusion in a container and/or commercial display), and can include SOC circuits, such as the examples previously described in reference to FIGS. 1 through 4. As used herein, "container" refers broadly to any form of physical container or package suitable for containing or packaging batteries, and/or devices containing batteries (broadly, charge-storing devices and/or devices including charge-storing devices). In embodiments, a container can include a retainer to hold a battery (or, alternatively, a group of batteries) and/or devices including batteries, within the container, such as a slot or other form of retention or mounting apparatus, and the retainer can include, or be associated with, an SOC circuit.

For example, a shipping, and/or storage, container for one or more batteries can include SOC circuits that connect to the batteries and can indicate an SOC of the batteries. Indicators (e.g., LEDs, or displays) associated with (e.g., activated by) SOC circuits can be located in, or on, a container so as to be observable (e.g., visible) without opening or otherwise manipulating the container. Accordingly, the SOC circuits can indicate to an external observer that particular batteries (or, alternatively, groups of batteries) exceed, or do not exceed, a voltage corresponding to an SOC threshold voltage. For example, a battery that exceeds a voltage corresponding to a regulatory limit SOC can cause an associated SOC circuit to illuminate an LED visible external to the container, and a battery that does not exceed a voltage corresponding to the regulatory limit SOC can cause the associated SOC circuit to not illuminate the LED.

Figure 5:
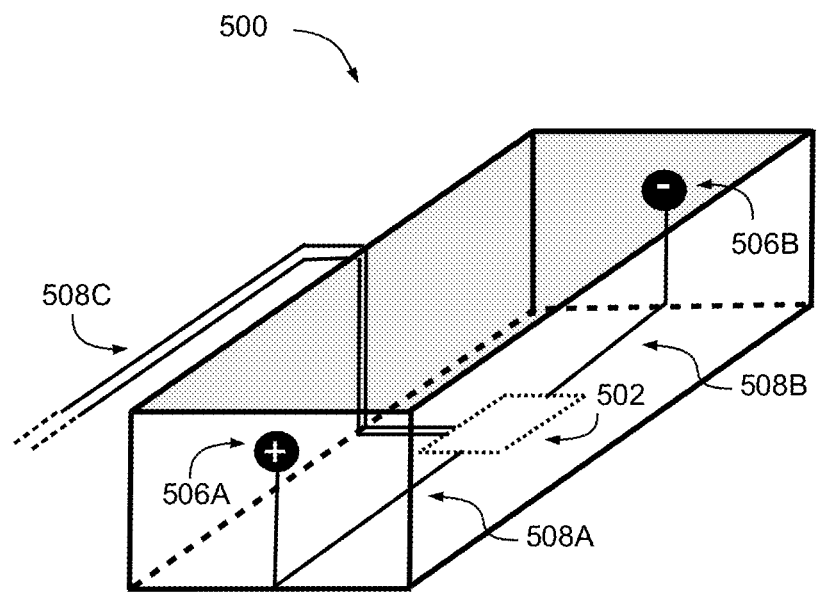
FIG. 5 illustrates an example battery slot including a state-of-charge circuit, according to aspects of the disclosure.

To illustrate, FIG. 5 depicts an example retainer, battery slot 500, which can be suitable, in embodiments, for storing and/or transporting a battery in a container, and which can include an SOC circuit. A battery slot, such as 500, can be formed, for example, as an impression within a bed of a container, or can be a pair of circuit contacts (e.g., metal clips) configured to retain a battery in a position within a container. In another example, a battery slot, such as 500, can be a stand-alone package for a battery, which can in turn be mounted, or otherwise included, in a container.

Example battery slot 500, in FIG. 5, comprises SOC circuit 502, which connects to SOC circuit contacts 506A and 506B by means of wires 508A and 508B, respectively. SOC circuit 502 can be similar to, for example, any of example SOC circuits 100, 200, 300, or 400 as shown in FIGS. 1, 2, 3, and 4, respectively. SOC circuit contacts 506A and 506B can connect to terminals (e.g., positive and negative polarity) of a battery inserted into slot 500, and can use wires 508A and 508B to connect the battery to SOC circuit 502 similar to the manner SOC circuit contacts 102A and 104A connect a battery to SOC circuit 100 in FIG. 1; 202A and 204A connect a battery to SOC circuit 200 and 300 of respective FIGS. 2 and 3; or, 402A and 404A connect a battery to SOC circuit 400, in FIG. 4.

In embodiments, an indicator can be mounted, or otherwise exposed, external to a container, such that the indication can be observed without manipulation of the container and/or the slot within the container or package. In embodiments, wires 508C can connect SOC circuit 502 (or, an indicator circuit included within an SOC circuit) to an indicator, such as a visual (e.g., an LED) and/or audible (e.g., a speaker) indicator observable external to a container that includes battery slots such as the example of 500. In embodiments, wires 508C can comprise, for example, a positive and negative wire (or, for example, using an SOC circuit such as 200 of FIG. 2, a pair of positive and negative wires) to connect an indicator (or a plurality of indicators, such as in SOC circuit 200) to SOC circuit 502 or, alternatively, can comprise in interface from a micro-controller to a display device that is observable external to a container that includes battery slots, such as the example of 500.

Figure 6:
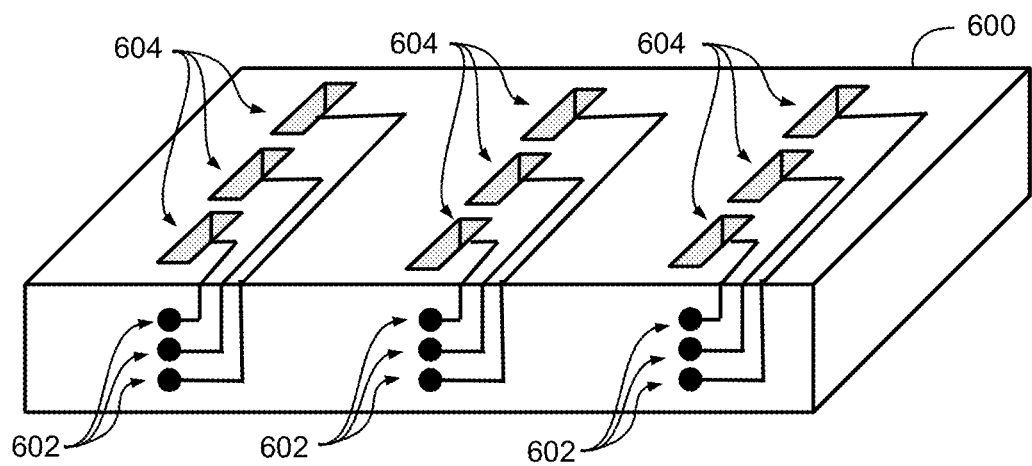
FIG. 6 illustrates an example container including an example battery slot, according to aspects of the disclosure.

To further illustrate the example of FIG. 5, FIG. 6 depicts an example battery container utilizing SOC circuitry and indicators visible external to the container. Example battery container 600 comprises a plurality of battery slots, 604. For purposes of illustrating the example, but not intended to limit embodiments, each of slots 604 can be considered to be an instance of slot 500 of FIG. 5. In embodiments, battery slots 604 can be formed in container 600 as impressions within container 600, or can be formed as any means of a slot, retainer, or mount, (for example) suitable to connect a battery, or group of batteries, to a corresponding SOC circuit.

Container 600 further comprises SOC indicators 602, which can be located on an external surface of the container, or otherwise made observable external to container 602. In embodiments, and using the example of battery slot 500 of FIG. 5, SOC circuit 502 of each slot 604 can be connected (e.g., by means of wires 508C) in a one-to-one relationship to a corresponding one (or, alternatively, a set) of indicators 602. In embodiments, indicators 602 can be visual indicators, such as LEDs similar to the examples of FIGS. 1 through 3, or can be one or more displays such as described in reference to SOC circuit 400 of FIG. 4.

Externally observable indicators, such as 602, need not, be, or be solely, visual indicators in embodiments. Rather, embodiments can utilize audible indicators in place of, or in addition to, visual indicators. Embodiments can include communications interfaces that can receive SOC circuit signals (e.g., voltages output from an SOC threshold circuit, or information from a micro-controller) that activate indicators 602, in addition to or in lieu of activating indicators 602, and the communications interface can transmit one or more messages associated with the SOC circuit signals on a communications network.

Embodiments can utilize a container such as 600, for example, as a container for storing, displaying, and/or transporting one or more batteries and can be capable of indicating one or more batteries having an SOC exceeding an SOC regulatory limit (e.g., 30% of battery capacity for transporting a lithium-ion battery by air). In embodiments, SOC circuits within each slot 604 of container 600 can be designed such that the SOC circuit of each slot illuminates the corresponding indicator 602 (e.g., according to the manner of example SOC circuits in FIGS. 1 through 4) when a battery connected to the slot has a voltage that exceeds, for example, a regulatory SOC limit.

Similarly, in embodiments, SOC circuits within each slot 604 of container 600 can be designed such that an SOC circuit of the slot turns off the corresponding indicator 602 (e.g., according to the manner of example SOC circuits in FIGS. 1 through 4) when a battery connected to the slot has a voltage that does not exceed, for example, a regulatory SOC limit. In this way, an external observer can determine that one or more batteries within an instance of container 600 exceed the SOC limit by observing that one or more corresponding indicators 602 is activated (e.g., an LED is illuminated). Conversely, in this way, an external observer can determine that one or more batteries within an instance of container 600 does not exceed SOC limit by observing that one or more corresponding indicators is not activated (e.g., an LED is not illuminated).

While FIG. 6 illustrates container 600 comprising a plurality of battery slots 604, and corresponding indicators 602, it would be apparent to one of ordinary skill in the art that an embodiment of a battery container can further include a plurality of instances of container 600, or a plurality of battery packages that can include SOC circuits and corresponding indicators (e.g., LEDs). For example, a battery package can contain one or more batteries, each battery within the package can be connected to an SOC circuit (such as those of the foregoing examples), and each SOC circuit can activate an LED when the battery exceeds a particular threshold SOC (e.g., a regulatory SOC limit). A container for the packages can externally expose the LEDs of each package (e.g., using a fiber optic filament or cable) within the container, such that observing the state of the package LEDs external to the container can indicate that one or more batteries within packages of the container is above the threshold SOC.

In embodiments, retainers suitable for charge-storing devices, and/or devices including charge-storing devices (e.g., batteries or devices including batteries), within a container, can be other than slots such as the examples of FIGS. 5 and 6. It would be apparent to one of ordinary skill in the art that embodiments can employ any of a variety of retainer geometries (e.g., disc or tubular slot geometries) and/or retention or mounting apparatus (e.g., plastic retainers and/or electrically conductive clips, or leads, connecting battery terminals to SOC circuit contacts), in combination with SOC circuits and/or threshold indicators, according to the structure of a particular charge-storing device, and/or a device including a charge-storing device, to be placed within a container.

Embodiments of a container, such as 600, can employ a variety of materials to contain batteries and/or form slots for the batteries, such as cardboard, foam, or metal, or combinations thereof. Embodiments of a container can be single use, or can be reusable. In embodiments, a container can contain only a single battery, such as a container for a large battery used marine or commercial applications. It would be apparent to one of ordinary skill in that art that embodiments of a container utilizing SOC circuits, such as the foregoing example of container 600, can be formed in a variety of geometries, utilize a variety of materials, and/or contain one or a plurality of batteries (or, broadly, charge storing devices such as previously described), within the scope of the disclosure.

Figure 7:
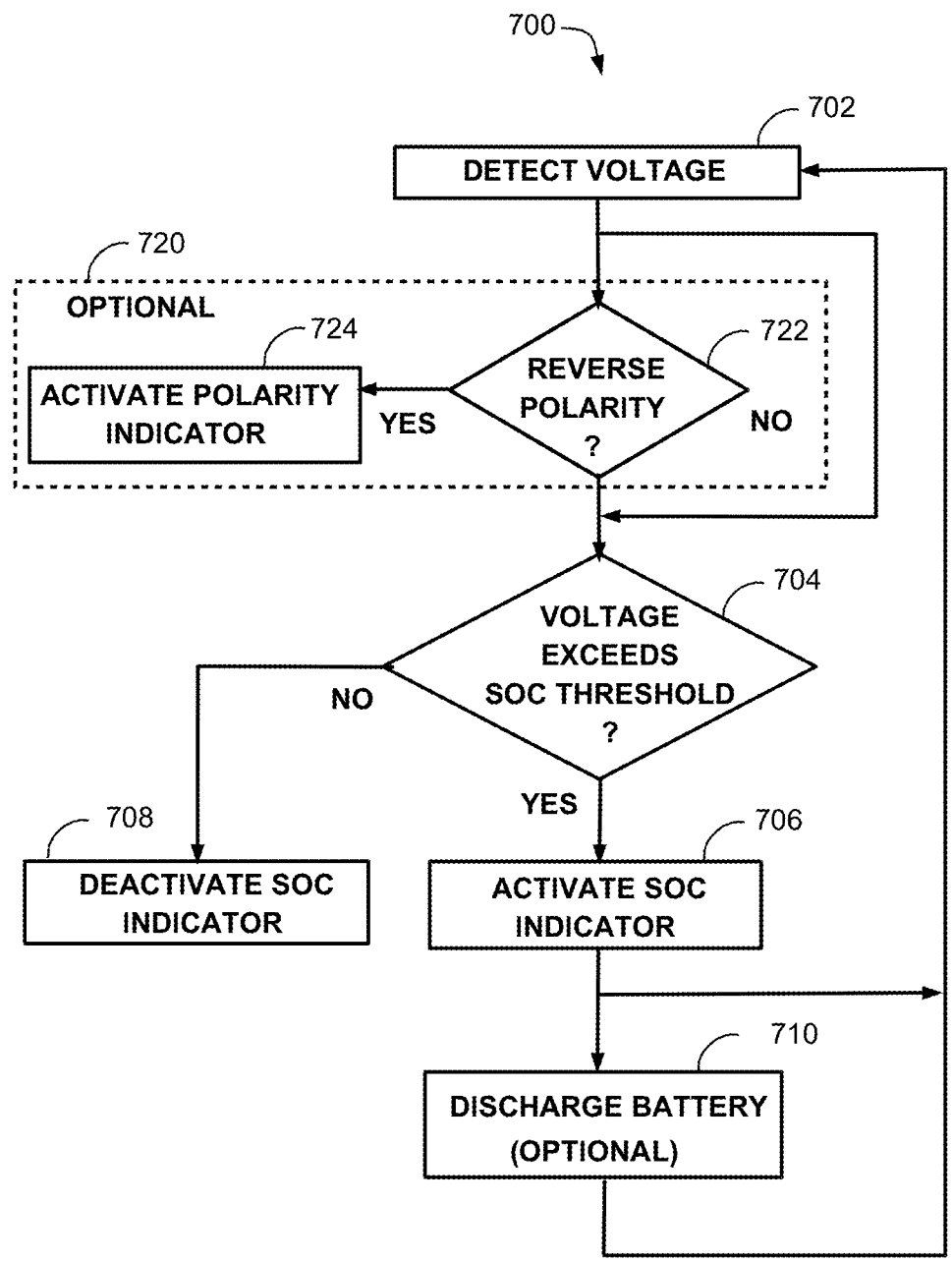
FIG. 7 is a flowchart that illustrates an example method to indicate a threshold state-of-charge, according to aspects of the disclosure.

Embodiments can include a method to indicate an SOC condition of a battery. FIG. 7 illustrates example method 700 to indicate that a battery exceeds a threshold SOC, such as a regulatory limit SOC for transporting batteries. For purposes of illustrating the method, but not intended to limit embodiments, the method is described herein as performed by a circuit, such as an SOC circuit using the examples of FIGS. 1 through 4, in contact with a battery (e.g., connected to battery positive and negative terminals).

At 702, the circuit detects a voltage of a battery between two contacts of the circuit. At 704, the circuit determines if the battery voltage exceeds a particular threshold voltage, such as a voltage corresponding to a particular SOC. In embodiments, one contact of the circuit can have a positive electric polarity and the other contact can have a negative electric polarity and, at 702, the circuit can detect the battery voltage if the battery is connected to the circuit in normal polarity (e.g., a positive polarity terminal of a battery connected to a positive polarity contact of the circuit, and a negative polarity terminal of the battery connected to a negative polarity contact of the circuit). In alternative embodiments, at 702, the circuit can detect the battery voltage in either normal or reverse polarity (e.g., a positive polarity terminal of a battery connected to a negative polarity contact of the circuit, and a negative polarity terminal of the battery connected to a positive polarity contact of the circuit). In embodiments of the method, the circuit can operate so as to minimally discharge the battery below the threshold voltage while the battery remains in contact with the circuit.

Optionally, in response to detecting a battery voltage at 702, the circuit can perform sub-method 720. At 722, the circuit can determine if the battery is connected in reverse polarity. If the circuit, at 722, detects the battery connected in reverse polarity, at 724 the circuit can activate an indicator (e.g., an LED) to indicate the reverse polarity condition. Such embodiments can perform sub-method 720 using, for example, a polarity detection circuit such as 160 of FIG. 1. In some embodiments, the SOC indicator LED can also be used to indicate reverse polarity. The LED can be bi-color to indicate threshold SOC verses reverse polarity or a uni-colored LED can simply indicate that there is an issue with a particular battery (i.e., a lit LED may indicate that the threshold SOC was exceeded or a battery in reverse polarity). Such embodiments can perform sub-method 720 using, for example, a polarity detection circuit such as 160 of FIG. 1.

If, at 704, the circuit determines that the battery voltage exceeds the SOC threshold voltage, at 706 the circuit can activate an SOC indicator. If, at 704, the circuit determines that the battery voltage does not exceed the SOC threshold voltage, at 708 the circuit can place or, alternatively, maintain, the SOC indicator in an inactive state. In response to determining, at 704, that the battery voltage does not exceed the SOC threshold voltage, embodiments can minimally discharge the battery.

Embodiments can perform 704, 706, and/or 708 using, for example, an SOC threshold circuit and/or SOC indicator circuit, such as previously described in the example SOC circuits of FIGS. 1 through 4. In response to activating, at 706, an SOC indicator, the circuit can repeat 702 and 704 to continue to determine if the voltage detected at 702 exceeds the SOC threshold voltage.

In response to determining, at 704, that the battery voltage exceeds the SOC threshold voltage, embodiments can, optionally, perform 710 to discharge the battery to a voltage that does not exceed the SOC threshold voltage. To discharge the battery, at 710, embodiments can, for example, use methods previously described in reference to SOC circuits 100, 200, and 300 of FIGS. 1, 2, and 3. The circuit can repeat 702 through 710 to continue to discharge the battery until the battery reaches a voltage that does not exceed (e.g., is equal to or, optionally, less than) the SOC threshold voltage.

While the foregoing examples are directed to charge-storing devices (e.g., batteries and/or capacitors) themselves, it would be apparent to one of ordinary skill in the art that, in embodiments, SOC circuits can further apply to devices that include, or incorporate, charge-storing devices. For example, a shipping container can contain laptop computers, mobile phones, and/or other consumer electronic devices, and embodiments of a shipping container (or, other packaging) can include SOC circuits, such as the previously described examples, to indicate an SOC of the charge-storing devices (e.g., a battery) within the laptop computers, mobile phones, and/or other consumer electronic devices contained in the shipping container, and that SOC indicators can be made visible, in embodiments, external to packages containing these devices, and/or the shipping container.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A shipping container, the shipping container comprising:
   a plurality of retainers, each of the plurality of retainers configured to hold a respective battery for transport in the shipping container, the respective battery among a first plurality of batteries for transport in the shipping container;
   a plurality of state-of-charge (SOC) indicators, each of the plurality of SOC indicators located on an external surface of the shipping container; and,
   a plurality of SOC circuits,
   wherein each of the plurality of SOC circuits is integrated into a respective retainer, among the plurality of retainers;
   wherein each of the plurality of SOC circuits is communicatively coupled to a respective SOC indicator among the plurality of SOC indicators;
   wherein each of the plurality of SOC circuits comprises polarity contacts configured to make electrical contact with polarity contacts of the respective battery, the electrical contact established by insertion of the respective battery into the respective retainer and continuous while the respective battery is held by the respective retainer for transport; and,
   wherein each of the plurality of SOC circuits is configured to:
   detect, based on the continuous electrical contact, that the respective battery has an SOC greater than a threshold SOC;
   in response to the detecting that the respective battery has the SOC greater than the threshold SOC, place the respective SOC indicator in a state indicative of the respective battery having the SOC greater than the threshold SOC;
   detect, based on the continuous electrical contact with the respective battery, that the respective battery has an SOC not greater than the threshold SOC; and,
   in response to the detecting that the respective battery has the SOC not greater than the threshold SOC, place the respective SOC indicator in a state indicative of the battery having the SOC not greater than the threshold SOC.

2. The shipping container of claim 1, wherein the threshold SOC corresponds to a maximum SOC of the respective battery to safely transport the respective battery.

3. The shipping container of claim 1, wherein an SOC circuit, among the plurality of SOC circuits, is further communicatively coupled to a reverse polarity indicator; and,
   wherein the SOC circuit is further configured to:
   detect that the continuous electrical contact between the SOC circuit and the respective battery is a reverse polarity contact; and,
   in response to the detecting that the respective battery makes the reverse polarity contact, place the reverse polarity indicator in a state to indicate the reverse polarity contact.

4. The shipping container of claim 1, wherein each of the SOC circuits, among the plurality of SOC circuits, further comprises a switch; and,
   wherein each of the SOC circuits, among the plurality of SOC circuits, is configured to make the continuous electrical contact with the respective battery using the switch.

5. The shipping container of claim 1, wherein an SOC circuit, among the plurality of SOC circuits, is further configured to use an auxiliary power source to provide power to the SOC circuit.

6. The shipping container of claim 1, wherein an SOC circuit, among the plurality of SOC circuits, is further configured to use the continuous electrical contact with the respective battery, in response to the detecting that the respective battery has the SOC greater than the threshold SOC, to discharge the respective battery to the SOC not greater than the threshold SOC.

7. The shipping container of claim 1, wherein each of the plurality of retainers comprises one of a slot to hold the respective battery and a mount to hold the respective battery.

8. The shipping container of claim 1, wherein the shipping container is reusable to transport a second plurality of batteries.

9. The shipping container of claim 1, wherein a first retainer, among the plurality of retainers, is further configured to hold an electronic device;
   wherein the respective battery held by the first retainer is installed in the electronic device; and,
   wherein the SOC circuit integrated into the first retainer is further configured to make the continuous electrical contact with the respective battery, held by the first retainer, with the respective battery installed in the electronic device.

10. The shipping container of claim 1, wherein each of the plurality of SOC indicators is selected from a group consisting of: a visual indicator observable external to the shipping container, an auditory indicator observable external to the shipping container, and a device configured to wirelessly communicate that the respective battery has the SOC greater than the threshold SOC and to wirelessly communicate that the respective battery has the SOC not greater than the threshold SOC.

11. The shipping container of claim 1, wherein an SOC circuit, among the plurality of SOC circuits, is further configured to detect the SOC greater than the threshold SOC, and to detect the SOC not greater than the threshold SOC, with the continuous electrical contact in either normal polarity, or in reverse polarity, contact with the respective battery held in the retainer that integrates the SOC circuit.

12. A method of transporting batteries within a shipping container, the shipping container comprising a plurality of retainers, each of the plurality of retainers configured to hold a respective battery, among a first plurality of batteries, for transport in the shipping container, the shipping container further comprising a plurality of state-of-charge (SOC) indicators and a plurality of SOC circuits, wherein each of the plurality of SOC circuits is integrated into a respective retainer among the plurality of retainers, wherein each of the plurality of SOC indicators is located on an external surface of the shipping container, wherein each of the plurality of SOC circuits is communicatively coupled to a respective SOC indicator among the plurality of SOC indicators, and
   wherein the method comprises each of the plurality of SOC circuits:
   making electrical contact with the respective battery, held by the respective retainer, the electrical contact established by insertion of the respective battery into the respective retainer and continuous while the respective battery is held by the respective retainer;

detecting, based on the continuous electrical contact, that the respective battery has an SOC greater than a safe SOC, the safe SOC corresponding to a maximum SOC to safely transport the respective battery; and, in response to detecting that the respective battery has the SOC greater than the safe SOC, placing the respective SOC indicator in a state indicative of the respective battery having the SOC greater than the safe SOC.

13. The method of claim 12, wherein the method further comprises each of the plurality of SOC circuits:

detecting, based on the continuous electrical contact, that the respective battery has an SOC not greater than the safe SOC; and, in response to detecting that the respective battery has the SOC not greater than the safe SOC, placing the SOC indicator associated with the respective retainer in a state indicative of the respective battery having the SOC not greater than the safe SOC.

14. The method of claim 12, the method further comprising an SOC circuit, among the plurality of SOC circuits, in response to the detecting that the respective battery has the SOC greater than the safe SOC, discharging the respective battery to an SOC not greater than the safe SOC.

15. The method of claim 12, wherein a first retainer, among the plurality of retainers, is further configured to hold an electronic device;

wherein the respective battery, held by the first retainer, is installed in the electronic device; and, wherein the method further comprises the SOC circuit integrated into the first retainer making the continuous electrical contact with the respective battery installed in the electronic device.

16. The method of claim 12, wherein the shipping container is reusable for transporting a second plurality of batteries.

17. The method of claim 12, wherein each of the plurality of SOC indicators is selected from a group consisting of a visual indicator observable external to the shipping container, an auditory indicator observable external to the shipping container, and a device configured to wirelessly communicate that the respective battery has the SOC greater than the safe SOC.

18. The method of claim 12, wherein the continuous electrical contact comprises an SOC circuit, among the plurality of SOC circuits, making the continuous electrical contact in either normal polarity or reverse polarity; and, wherein in the method the SOC circuit detecting the SOC greater than the safe SOC comprises the SOC circuit detecting the SOC greater than the safe SOC with the continuous electrical contact in either the normal polarity or the reverse polarity.

19. The method of claim 12, wherein an SOC circuit, among the plurality of SOC circuits, is further communicatively coupled to a reverse polarity indicator; and, wherein the method further comprises the SOC circuit:

detecting that the continuous electrical contact with the respective battery, held by the respective retainer, comprises a reverse polarity contact; and, in response to the detecting that the respective battery makes the reverse polarity contact, placing the reverse polarity indicator in a state to indicate the reverse polarity contact.

* * * * *